(12) United States Patent
Umeta et al.

(10) Patent No.: US 11,326,275 B2
(45) Date of Patent: May 10, 2022

(54) SiC EPITAXIAL GROWTH APPARATUS HAVING PURGE GAS SUPPLY PORTS WHICH SURROUND A VICINITY OF A RAW MATERIAL GAS SUPPLY PORT

(71) Applicant: SHOWA DENKO K.K., Tokyo (JP)

(72) Inventors: Yoshikazu Umeta, Chichibu (JP); Hironori Atsumi, Chichibu (JP)

(73) Assignee: SHOWA DENKO K.K., Tokyo (JP)

( * ) Notice: Subject to any disclaimer, the term of this patent is extended or adjusted under 35 U.S.C. 154(b) by 65 days.

(21) Appl. No.: 16/699,355

(22) Filed: Nov. 29, 2019

(65) Prior Publication Data
US 2020/0173053 A1 Jun. 4, 2020

(30) Foreign Application Priority Data
Nov. 30, 2018 (JP) .............................. JP2018-225520

(51) Int. Cl.
C30B 35/00 (2006.01)
C30B 25/14 (2006.01)
C30B 29/36 (2006.01)

(52) U.S. Cl.
CPC .............. *C30B 25/14* (2013.01); *C30B 29/36* (2013.01); *C30B 35/002* (2013.01)

(58) Field of Classification Search
CPC ......... C30B 25/00; C30B 25/02; C30B 25/08; C30B 25/14; C30B 25/16; C30B 25/165; C30B 29/00; C30B 29/10; C30B 29/36; C30B 35/00; C30B 35/002; C23C 16/455; C23C 16/45502; C23C 16/45504; C23C 16/45514; C23C 16/45519; C23C 16/45563; C23C 16/45576
USPC .... 117/84, 88, 102, 937, 951; 118/715, 719, 118/726
See application file for complete search history.

(56) References Cited

U.S. PATENT DOCUMENTS

| 4,800,173 A * | 1/1989 | Kanai | C23C 16/452 |
| | | | 117/102 |
| 2006/0021574 A1* | 2/2006 | Armour | C23C 16/45565 |
| | | | 118/715 |
| 2017/0345658 A1* | 11/2017 | Fukada | C23C 16/455 |

FOREIGN PATENT DOCUMENTS

| DE | 11 2017 001 127 T5 | 11/2018 |
| JP | 2017-011182 A | 1/2017 |
| WO | WO-2016098638 A1 * | 6/2016 ........... C23C 16/325 |

\* cited by examiner

*Primary Examiner* — Kenneth A Bratland, Jr.
(74) *Attorney, Agent, or Firm* — Sughrue Mion, PLLC (57) ABSTRACT

A SiC epitaxial growth apparatus according to an embodiment includes a mounting stand on which a SiC wafer is mounted, and a furnace body which is configured to cover the mounting stand, and the furnace body includes a raw material gas supply port which is positioned so as to face the mounting stand and is configured to supply a raw material gas to the growth space, a first purge gas supply port which surrounds a vicinity of the raw material gas supply port and is configured to supply a purge gas to the growth space, and a second purge gas supply port which surrounds a vicinity of the first purge gas supply port and is configured to supply a purge gas to the growth space.

7 Claims, 7 Drawing Sheets

FIG. 7

SIC EPITAXIAL GROWTH APPARATUS HAVING PURGE GAS SUPPLY PORTS WHICH SURROUND A VICINITY OF A RAW MATERIAL GAS SUPPLY PORT

BACKGROUND OF THE INVENTION

Field of the Invention

The present invention relates to a SiC epitaxial growth apparatus.

Priority is claimed based on Japanese Patent Application No. 2018-225520, filed Nov. 30, 2018, the content of which is incorporated herein by reference.

Description of Related Art

Silicon carbide (SiC) has characteristics such as a dielectric breakdown electric field one order of magnitude larger, a band gap three times larger, and a thermal conductivity approximately three times higher than that of silicon (Si). For this reason, silicon carbide (SiC) is expected to be applied to power devices, high-frequency devices, high-temperature operating devices, and the like.

In order to promote the practical application of SiC devices, it is essential to establish a high-quality SiC epitaxial wafer and a high-quality epitaxial growth technique.

SiC devices are generally manufactured using a SiC epitaxial wafer obtained by growing an epitaxial film serving as an activated region of a device on a SiC wafer, obtained by being processed from SiC bulk single crystal grown by sublimation recrystallization or the like, through chemical vapor deposition (CVD) or the like. Meanwhile, in the present specification, a SiC epitaxial wafer means a wafer after an epitaxial film is formed, and a SiC wafer means a wafer before an epitaxial film is formed.

Patent Document 1 discloses a silicon carbide semiconductor manufacturing apparatus having an introduction port that gradually expands toward a growth chamber side. The silicon carbide semiconductor manufacturing apparatus disclosed in Patent Document 1 can suppress an in-plane distribution difference in a carrier density in a SiC semiconductor substrate by widening an introduction range of various gases.

PATENT DOCUMENTS

[Patent Document 1] Japanese Unexamined Patent Application, First Publication No. 2017-11182

SUMMARY OF THE INVENTION

A raw material gas decomposes in a growth chamber and then reacts to form SiC. When a Si-based raw material gas and a C-based raw material gas decompose in the vicinity of a gas supply port and react, SiC deposits are generated in the vicinity of the gas supply port. The SiC deposits disturb a flow of a raw material gas or the like. The flow of the raw material gas or the like is one factor for determining the quality of a SiC epitaxial film. It is difficult to clean a SiC epitaxial growth apparatus every time one film is formed in order to increase production efficiency. SiC deposits differ between a state immediately after cleaning is performed and a state after a plurality of films are formed. There is a demand for a SiC epitaxial growth apparatus with little variation in growth conditions between immediately after cleaning is performed and after a plurality of films are formed.

The present invention is contrived in view of the above-described problems, and an object thereof is to obtain a SiC epitaxial growth apparatus with little variation in growth conditions.

The inventors have found, as a result of intensive research, that it is possible to realize a SiC epitaxial manufacturing apparatus with less variation in growth conditions by providing two purge gas supply ports in the vicinity of a raw material gas supply port.

That is, the present invention provides the following means in order to solve the above-described problem.

(1) A SiC epitaxial growth apparatus according to a first aspect includes a mounting stand on which a SiC wafer is mounted and a furnace body which is configured to cover the mounting stand and includes a growth space therein, in which the furnace body includes a raw material gas supply port which is positioned so as to face the mounting stand and is configured to supply a raw material gas to the growth space, a first purge gas supply port which surrounds a vicinity of the raw material gas supply port and is configured to supply a purge gas to the growth space, and a second purge gas supply port which surrounds a vicinity of the first purge gas supply port and is configured to supply a purge gas to the growth space.

(2) The SiC epitaxial growth apparatus according to the aspect may be configured such that a flow velocity of the purge gas supplied from the second purge gas supply port becomes lower than a flow velocity of the purge gas supplied from the first purge gas supply port.

(3) In the SiC epitaxial growth apparatus according to the aspect, the first purge gas supply port may be configured so as to supply a purge gas to the growth space at a flow velocity of equal to or greater than 10 m/s and equal to or less than 100 m/s, and the second purge gas supply port may be configured so as to supply a purge gas to the growth space at a flow velocity of equal to or greater than 0.1 m/s and equal to or less than 10 m/s.

(4) In the SiC epitaxial growth apparatus according to the aspect, the second purge gas supply port may be positioned on a side outward from an outer periphery of the first purge gas supply port at a distance of 0.5 mm or more therefrom.

(5) In the SiC epitaxial growth apparatus according to the aspect, the first purge gas supply port may continuously surround an outer periphery of the raw material gas supply port, and the second purge gas supply ports may be scattered in the vicinity of the first purge gas supply port.

(6) In the SiC epitaxial growth apparatus according to the aspect, the raw material gas supply port may be a first end of a raw material gas supply pipe for supplying a raw material gas to the growth space, the first purge gas supply port may be a first end of a first purge gas supply pipe for supplying a purge gas to the growth space, and the second purge gas supply port may be a through hole formed in a partition wall that separates the growth space and a processing front chamber from each other.

(7) The SiC epitaxial growth apparatus according to the aspect may further include a plurality of the raw material gas supply ports, in which the plurality of raw material gas supply ports may include a Si-based gas supply port and a C-based gas supply port, and the second purge gas supply port may be positioned in a vicinity of the Si-based gas supply port.

A SiC epitaxial growth apparatus according to an aspect of the present invention has little variation in growth conditions.

DETAILED DESCRIPTION OF THE INVENTION

Hereinafter, a SiC epitaxial growth apparatus according to the present embodiment will be described in detail with reference to the accompanying drawings. In the drawings used in the following description, characteristic portions may be illustrated at an enlarged scale for convenience of easy understanding of characteristics, and the dimensional ratios and the like of the respective components are not necessarily the same as the actual ones. Further, in the following description, materials, dimensions, and the like are merely exemplary, do not limit the present invention, and can be appropriately modified within a range in which the gist is not changed.

Directions will be defined. A +z direction is a direction perpendicular to a mounting surface 20a on which a wafer is mounted, and is a direction directed to a ceiling portion 11 to be described later. A −z direction is a direction opposite to the +z direction. When these directions are not distinguished from each other, the directions will be referred to simply as a "z direction". In addition, the +z direction and the −z direction may be referred to as "upward" and "downward", respectively. An x direction is any one direction orthogonal to the z direction. A y direction is a direction orthogonal to the x direction and the z direction.

First Embodiment

Figure 1:
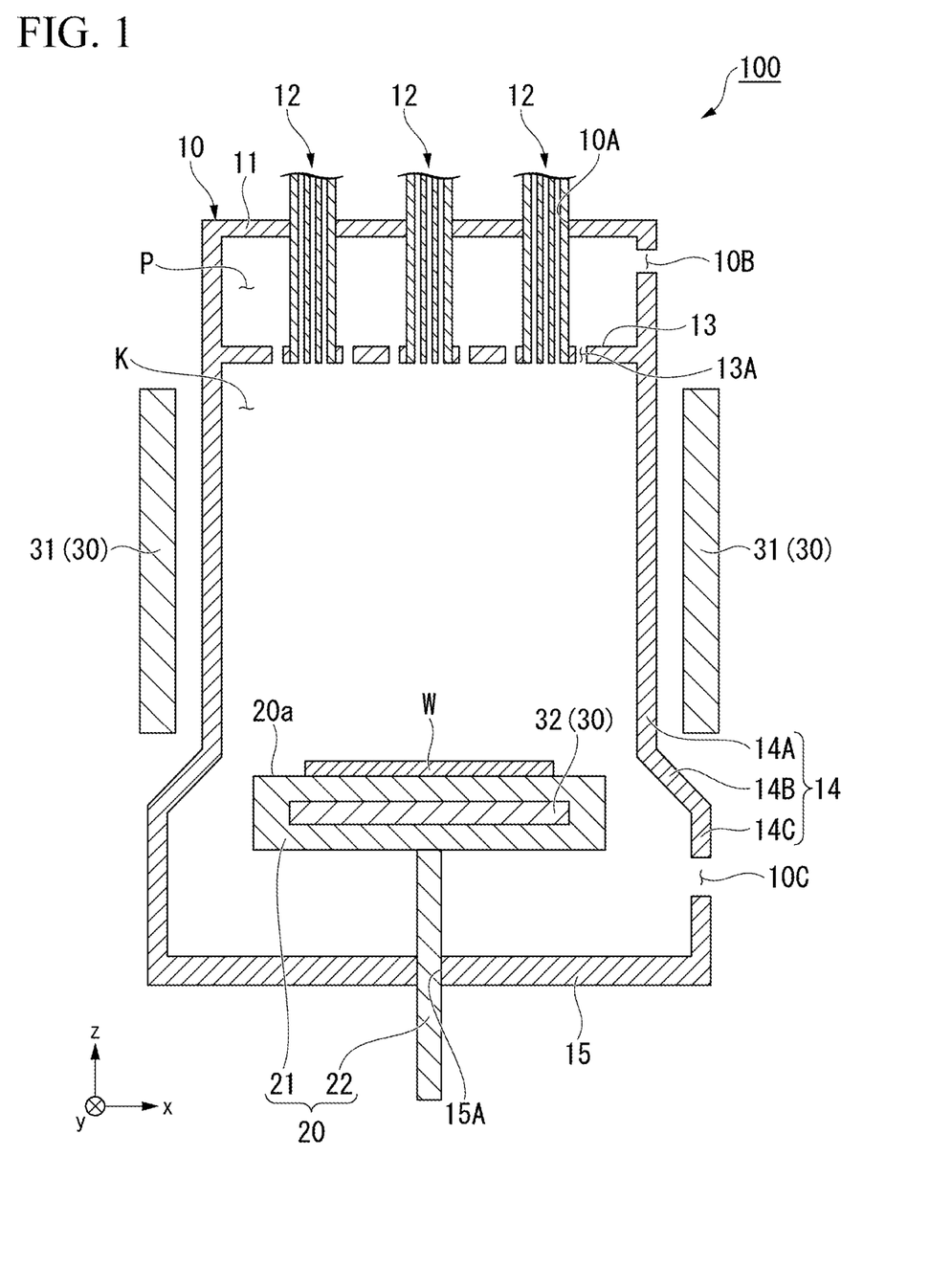
FIG. 1 is a cross-sectional view of a SiC epitaxial growth apparatus according to a first embodiment.

FIG. 1 is a schematic cross-sectional view of a SiC epitaxial growth apparatus 100 according to a first embodiment. FIG. 1 also shows a SiC wafer W on which a SiC epitaxial film is formed.

The SiC epitaxial growth apparatus 100 includes a furnace body 10, a mounting stand 20, and a heater 30.

(Furnace Body)

The furnace body 10 includes a ceiling portion 11, a gas supply portion 12, a partition wall 13, a side wall portion 14, and a bottom portion 15. The furnace body 10 includes a growth space K and a processing front chamber P therein. The growth space K and the processing front chamber P are partitioned by a partition wall 13. The furnace body 10 includes a first hole 10A, a second hole 10B, and a third hole 10C. The first hole 10A is a through hole into which a gas supply portion 12 to be described later is inserted. The second hole 10B is a supply port for supplying a purge gas to the processing front chamber P. The third hole 10C is an exhaust port for exhausting a gas from the growth space K.

The ceiling portion 11 is a portion which is positioned above the mounting stand 20 and is substantially parallel to a mounting surface 20a of the mounting stand 20. The ceiling portion 11 faces the mounting surface 20a. The ceiling portion 11 includes a plurality of first holes 10A into which the gas supply portion 12 is inserted.

The gas supply portion 12 is positioned above the mounting stand 20 so as to face the mounting surface 20a. The gas supply portion 12 is inserted into each of the plurality of first holes 10A. A first end of the gas supply portion 12 faces the growth space K, and a second end thereof is connected to a gas pipe (not shown).

Figure 2:
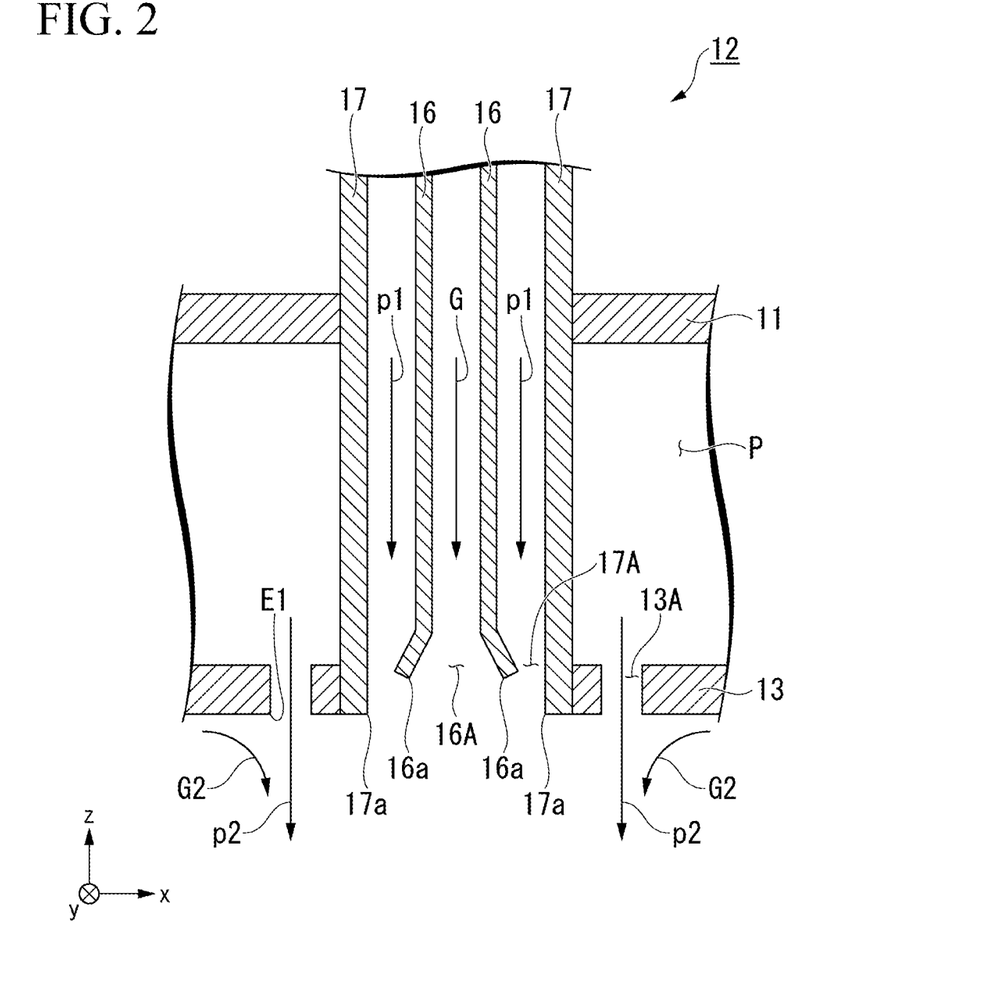
FIG. 2 is an enlarged cross-sectional view of the vicinity of a gas supply portion of the SiC epitaxial growth apparatus according to the first embodiment.

FIG. 2 is an enlarged cross-sectional view of the vicinity of the gas supply portion 12 of the SiC epitaxial growth apparatus 100. The gas supply portion 12 includes a raw material gas supply pipe 16 and a first purge gas supply pipe 17.

A raw material gas G flows through the raw material gas supply pipe 16. The raw material gas supply pipe 16 supplies the raw material gas G to the growth space K. In the raw material gas supply pipe 16, a first end 16a faces the growth space K. A portion surrounded by the first end 16a of the raw material gas supply pipe 16 is a raw material gas supply port 16A.

The raw material gas supply port 16A faces the mounting stand 20. The first end 16a of the raw material gas supply pipe 16 has a diameter that increases downward.

The raw material gas G reacts on the SiC wafer W to form an epitaxial film. The raw material gas G is, for example, a Si-based gas or a C-based gas. The Si-based gas is, for example, silane ($SiH_4$), dichlorosilane ($SiH_2Cl_2$), trichlorosilane ($SiHCl_3$), or tetrachlorosilane ($SiCl_4$). The C-based gas is, for example, propane ($C_3H_8$) or ethylene ($C_2H_4$). The raw material gas G may contain an etching gas (for example, HCl), a carrier gas (for example, Ar), a dopant gas (for example, $N_2$, and trimethylammonium (TMA)) in addition to the Si-based gas and the C-based gas.

The first end 16a of the raw material gas supply pipe 16 is positioned, for example, above a first end 17a of the first purge gas supply pipe 17. Since the raw material gas supply pipe 16 and the growth space K have different cross-sectional areas, a flow velocity of the raw material gas G varies significantly in the vicinity of the first end 16a of the raw material gas supply pipe 16.

The significant variation in flow velocity causes a turbulent flow. The vicinity of the raw material gas G is surrounded by a purge gas p1 at a point in time when the raw material gas reaches the growth space K, thereby suppressing a turbulent flow of the raw material gas G.

The purge gas p1 flows between the first purge gas supply pipe 17 and the raw material gas supply pipe 16. The first purge gas supply pipe 17 supplies the purge gas p1 to the growth space K. In the first purge gas supply pipe 17, a first end 17a faces the growth space K. A portion surrounded by the first end 17*a* of the first purge gas supply pipe 17 is a first purge gas supply port 17A. The first purge gas supply pipe 17 surrounds the vicinity of the raw material gas supply pipe 16. The first purge gas supply port 17A surrounds the vicinity of the raw material gas supply port 16A. The first purge gas supply port 17A is, for example, an opening that continuously surrounds the outer periphery of the raw material gas supply port 16A in the form of a concentric circle.

The purge gas p1 is, for example, a gas having an etching action containing $H_2$ or an inert gas typified by a noble gas such as Ar or He.

The purge gas p1 supplied from the first purge gas supply port 17A suppresses spreading of the raw material gas G in an xy direction. The SiC epitaxial film formed on the SiC wafer W is required to have in-plane uniformity. When the distance between the raw material gas supply port 16A and the mounting surface 20*a* is long, in-plane uniformity of the SiC epitaxial film increases. On the other hand, when the distance between the raw material gas supply port 16A and the mounting surface 20*a* is long, the raw material gas G spreads, and the efficiency of use of the raw material gas G decreases. When the flow rate of the raw material gas G is increased to increase a flow velocity when the raw material gas G is supplied to the growth space K, the efficiency of use of the raw material gas G increases. However, when the flow rate of the raw material gas G increases, the amount of gas which is used is increased, thereby increasing costs. When the purge gas p1 flows to the vicinity of the raw material gas G, a flow of the raw material gas G becomes a laminar flow along the purge gas p1. As a result, it is possible to efficiently send the raw material gas G to the SiC wafer W without increasing the flow rate of the raw material gas G.

The first purge gas supply port 17A supplies the purge gas p1 to the growth space K at a flow velocity of preferably equal to or greater than 10 m/s and equal to or less than 100 m/s, and more preferably equal to or greater than 20 m/s and equal to or less than 50 m/s. When the flow velocity of the purge gas p1 supplied from the first purge gas supply port 17A is in the above-described range, spreading of the raw material gas G can be further suppressed.

The width of the first purge gas supply port 17A in the radial direction is preferably equal to or greater than 0.5 mm and equal to or less than 10 mm, more preferably equal to or greater than 1.0 mm and equal to or less than 3.0 mm. The width of the first purge gas supply port 17A in the radial direction is a length of a perpendicular line that extends downward from any point on the outer periphery of the first end 16*a* of the raw material gas supply pipe 16 to the first purge gas supply pipe 17.

The partition wall 13 is inside the furnace body 10 (see FIG. 1). The partition wall 13 separates the growth space K and the processing front chamber P from each other. The partition wall 13 includes a plurality of through holes. A purge gas p2 is supplied to the processing front chamber P from the second hole 10B. The purge gas p2 supplied to the processing front chamber P is supplied to the growth space K from the through holes of the partition wall 13. The through holes provided in the partition wall 13 are second purge gas supply ports 13A. The same gas as that of the purge gas p1 can be used for the purge gas p2, and the purge gas p2 is the same gas as the purge gas p1 in principle.

Figure 3:
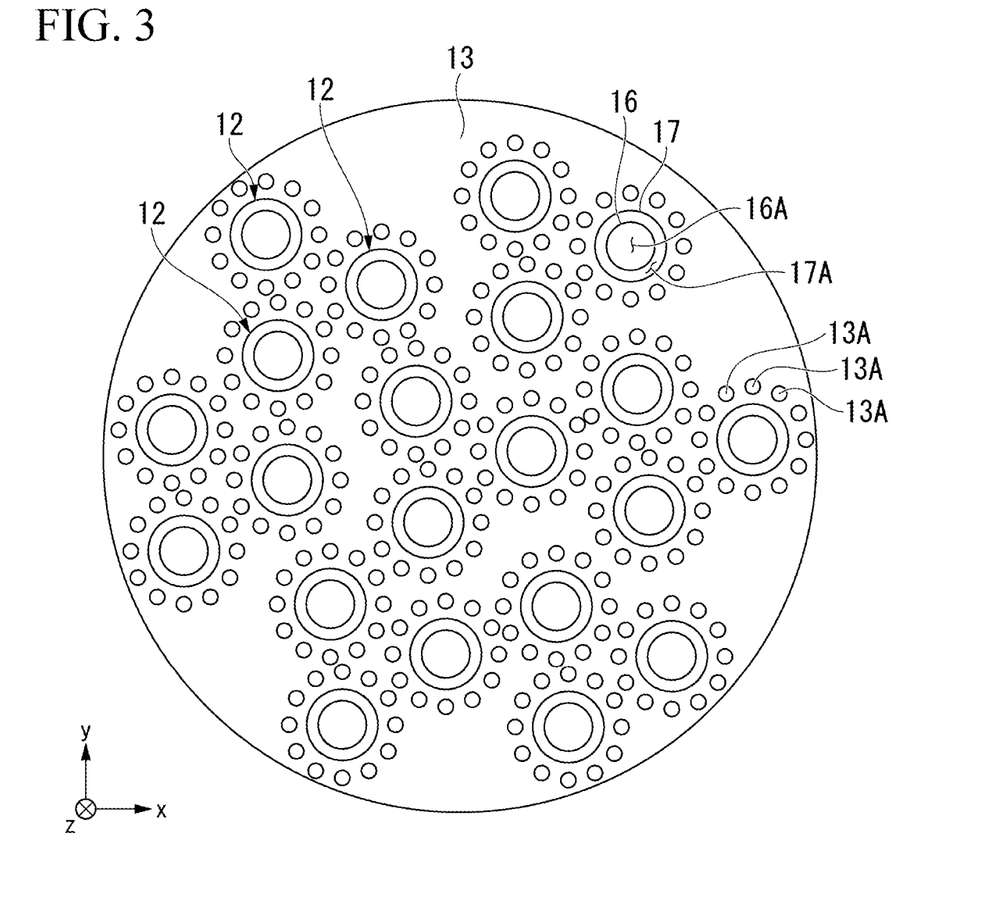
FIG. 3 is a plan view when a partition wall of the SiC epitaxial growth apparatus according to the first embodiment is seen from a growth space side.

FIG. 3 is a plan view when the partition wall 13 of the SiC epitaxial growth apparatus 100 is seen from the growth space K side. The second purge gas supply ports 13A are positioned on the side outward from the raw material gas supply pipe 16 and the first purge gas supply pipe 17 in a radial direction. The second purge gas supply ports 13A surround the vicinity of the first purge gas supply port 17A. The second purge gas supply ports 13A are scattered in the vicinity of the first purge gas supply port 17A. For example, the second purge gas supply ports 13A are scattered in a virtual circle which is concentrically located on the side outward from the first purge gas supply port 17A in a radial direction. For example, the partition wall 13 is supported at a point of contact with the first purge gas supply pipe 17.

The purge gas p2 supplied from the second purge gas supply port 13A suppresses the formation of SiC deposits in the vicinity of the raw material gas supply pipe 16. The SiC deposits are generated when a Si-based gas and a C-based gas decompose and react in the vicinity of the raw material gas supply port 16A. For example, it may be assumed that a first raw material gas G (for example, a Si-based gas) is supplied from any raw material gas supply port 16A, and a second raw material gas G2 (for example, a C-based gas) is supplied from an adjacent raw material gas supply port 16A. A portion of the second raw material gas G2 flows toward the adjacent raw material gas supply port 16A (see FIG. 2).

In a case where the partition wall 13 does not include the second purge gas supply port 13A, the second raw material gas G2 reaches the vicinity of the first purge gas supply port 17A and flows downward. The first raw material gas G and the second raw material gas G2 may react with each other in the vicinity of the first end 17*a* of the first purge gas supply pipe 17, and SiC deposits are formed in the vicinity of the first end 17*a*. The deposits deposited to the first end 17*a* cause disturbance of flows of the raw material gas G and the purge gas p1 supplied from the first purge gas supply port 17A. Changes in the state of supply of the raw material gas G and the purge gas p1 supplied from the first purge gas supply port 17A to the growth space K have a significant influence on growth conditions of the SiC epitaxial film.

On the other hand, in a case where the partition wall 13 includes the second purge gas supply port 13A, the second raw material gas G2 reaches the vicinity of the second purge gas supply port 13A and flows downward. For this reason, SiC deposits are deposited to a corner portion E1 on the side outward from the second purge gas supply port 13A in a radial direction. Here, "the outer side in a radial direction" is an outer side in a radial direction when the center of the raw material gas supply pipe 16 is set to be an axis. The second purge gas supply port 13A keeps the formation position of the SiC deposits away from the raw material gas supply port 16A.

The deposits deposited on the corner portion E1 cause disturbance of a flow of the purge gas p2 supplied from the second purge gas supply port 13A. However, the purge gas p2 supplied from the second purge gas supply port 13A does not control a flow of the raw material gas G. Thereby, changes in the state of supply of the purge gas p2, supplied from the second purge gas supply port 13A, to the growth space K do not have a significant influence on growth conditions of the SiC epitaxial film.

When the SiC deposits are not formed in the vicinity of the raw material gas supply port 16A, growth conditions of the SiC epitaxial film are stabilized. It is difficult to clean the SiC epitaxial growth apparatus 100 every time one film is formed in order to increase production efficiency. The formation position of the SiC deposits is kept away from the raw material gas supply port 16A, and thus it is possible to suppress variation in growth conditions of the SiC epitaxial film without performing cleaning.

For example, the second purge gas supply port 13A is positioned on a side outward from an outer periphery of the first purge gas supply port 17A at a distance of 0.5 mm or more therefrom. Here, a distance between the second purge gas supply port 13A and the first purge gas supply port 17A is a distance between the outer periphery of the first purge gas supply port 17A and the center of the second purge gas supply port 13A in a radial direction when the center of the raw material gas supply pipe 16 is set to be an axis. The second purge gas supply port 13A becomes distant from the outer periphery of the first purge gas supply port 17A, and thus the formation position of the SiC deposits can be kept from the raw material gas supply port 16A.

For example, a flow velocity of the purge gas p2 supplied from the second purge gas supply port 13A is lower than a flow velocity of the purge gas p1 supplied from the first purge gas supply port 17A. The purge gas p2 supplied from the second purge gas supply port 13A is supplied to the growth space K at a flow velocity of preferably equal to or greater than 0.1 m/s and equal to or less than 10.0 m/s, and more preferably equal to or greater than 0.3 m/s 0.3 m/s and equal to or less than 3.0 m/s. A high flow velocity of the purge gas p2 supplied from the second purge gas supply port 13A may cause a turbulent flow, and a low flow velocity thereof may increase a concern that SiC deposits will be formed in the vicinity of the first end 17a. In addition, the amount of purge gas p2 to be supplied from the second purge gas supply port 13A may be increased, which results in an increase in costs.

It is preferable that a diameter of the second purge gas supply port 13A be larger than the width of the first purge gas supply port 17A in a radial direction. It then becomes easy to control the flow velocity of the purge gas p2 to be supplied from the second purge gas supply port 13A.

The side wall portion 14 is a portion that surrounds the vicinity of a central axis (see FIG. 1). The central axis is an axis passing through the center of the SiC wafer W and extending in the z direction. The side wall portion 14 shown in FIG. 1 includes a first portion 14A, a second portion 14B, and a third portion 14C.

The first portion 14A is positioned above the SiC wafer W mounted on the mounting surface 20a. The inner diameter of the first portion 14A is slightly larger than the outer diameter of the mounting surface 20a. The raw material gas G is supplied to the SiC wafer W along the inner diameter of the first portion 14A while forming a laminar flow. The second portion 14B is a portion that connects the first portion 14A and the third portion 14C to each other. The diameter of the second portion 14B increases in the −z direction. An unreacted raw material gas G and the like flow downward along the second portion 14B. The third portion 14C is positioned below the SiC wafer W mounted on the mounting surface 20a. The inner diameter of the third portion 14C is larger than the inner diameter of the first portion 14A. The third portion 14C includes the third hole 10C. The unreacted raw material gas G and the like are discharged from the third hole 10C.

The bottom portion 15 is positioned so as to interpose the SiC wafer W between the bottom portion 15 and the ceiling portion 11. The bottom portion 15 is formed of, for example, stainless steel, an aluminum alloy, or brass. The bottom portion 15 includes a hole portion 15A through which the support shaft of the mounting stand 20 passes.

(Mounting Stand)

The mounting stand 20 includes the mounting surface 20a on which the SiC wafer W is mounted. The mounting stand 20 includes a support body 21 and a support shaft 22. The support body 21 supports the SiC wafer W. The support shaft 22 extends downward from the center of the support body 21. The support shaft 22 is connected to, for example, a rotation mechanism not shown in the drawing. The support body 21 is rotatable by the support shaft 22 rotating by the rotation mechanism. A second heater 32 to be described later is stored in the support body 21.

(Heater)

The heater 30 includes a first heater 31 and a second heater 32. The first heater 31 surrounds the outer periphery of the side wall portion 14 in a circumferential direction. The first heater 31 extends in the z direction along the side wall portion 14.

The second heater 32 is stored in the support body 21. Known heaters can be used for the first heater 31 and the second heater 32.

The SiC epitaxial growth apparatus 100 according to the first embodiment suppresses formation of SiC deposits in the vicinity of the raw material gas supply port 16A as described above. The SiC deposits cause disturbance of a flow of the raw material gas G. For example, growth conditions of the SiC epitaxial film differ between a state where the SiC deposits are not formed and a state where the SiC deposits are formed. In the SiC epitaxial growth apparatus 100 according to the first embodiment, the formation position of SiC deposits is kept away from the vicinity of the raw material gas supply port 16A, and thus it is possible to suppress variation in growth conditions of the SiC epitaxial film. In addition, the reproducibility of the manufactured SiC epitaxial film is increased.

While a preferred embodiment of the present invention has been described in detail, the present invention is not limited to a specific embodiment, and various modifications and changes can be made without departing from the scope of the present invention recited in claims.

Modification Example 1

Figure 4:
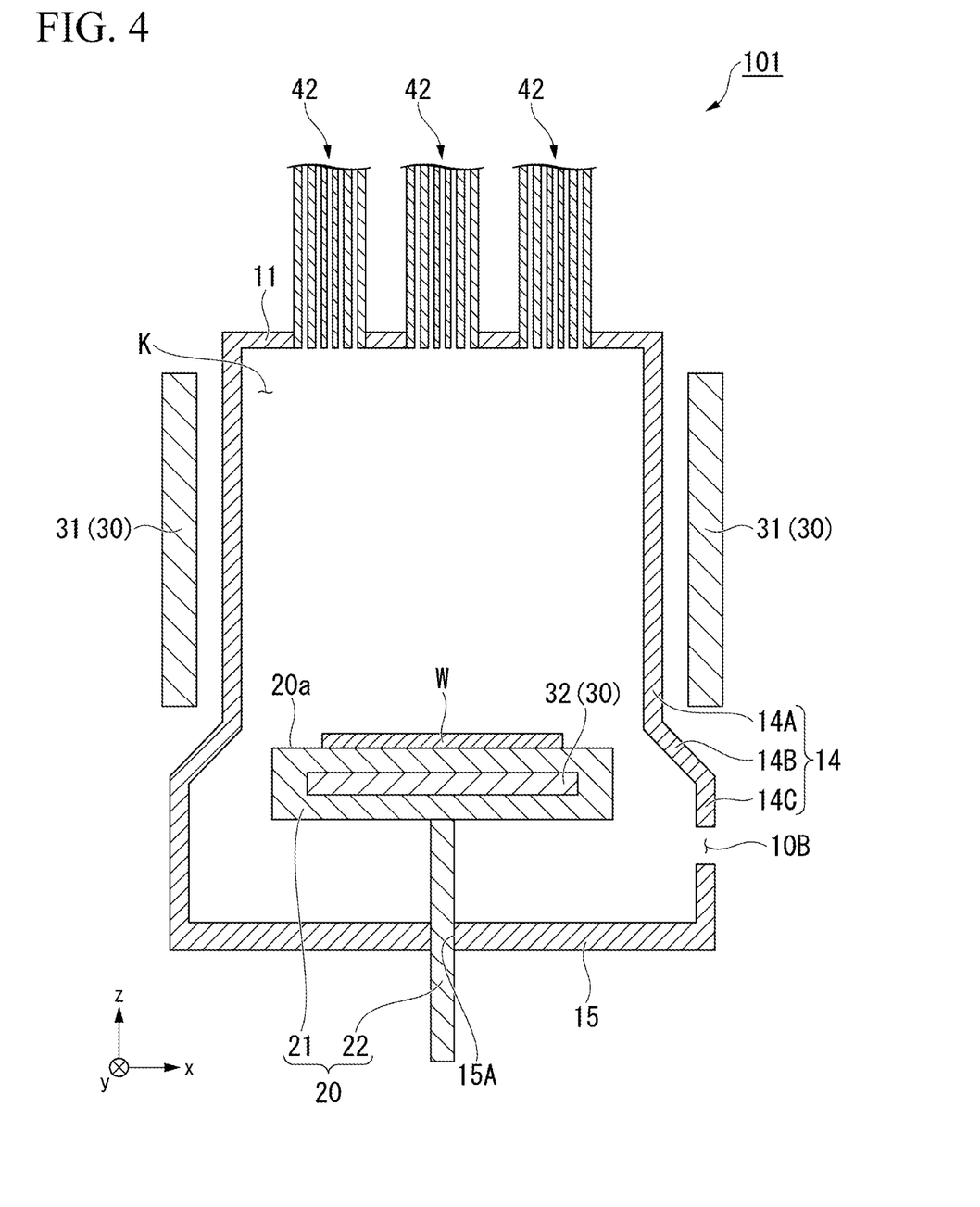
FIG. 4 is a cross-sectional view of a modification example of the SiC epitaxial growth apparatus according to the first embodiment.

FIG. 4 is a cross-sectional view of a SiC epitaxial growth apparatus 101 according to Modification Example 1. The SiC epitaxial growth apparatus 101 according to Modification Example 1 is different from the SiC epitaxial growth apparatus 100 shown in FIG. 1 in that the SiC epitaxial growth apparatus 101 does not include a partition wall 13 and a processing front chamber P and the shape of a gas supply portion 42 is different. The same components as those of the SiC epitaxial growth apparatus 100 shown in FIG. 1 will be denoted by the same reference numerals and signs, and description thereof will be omitted.

Figure 5:
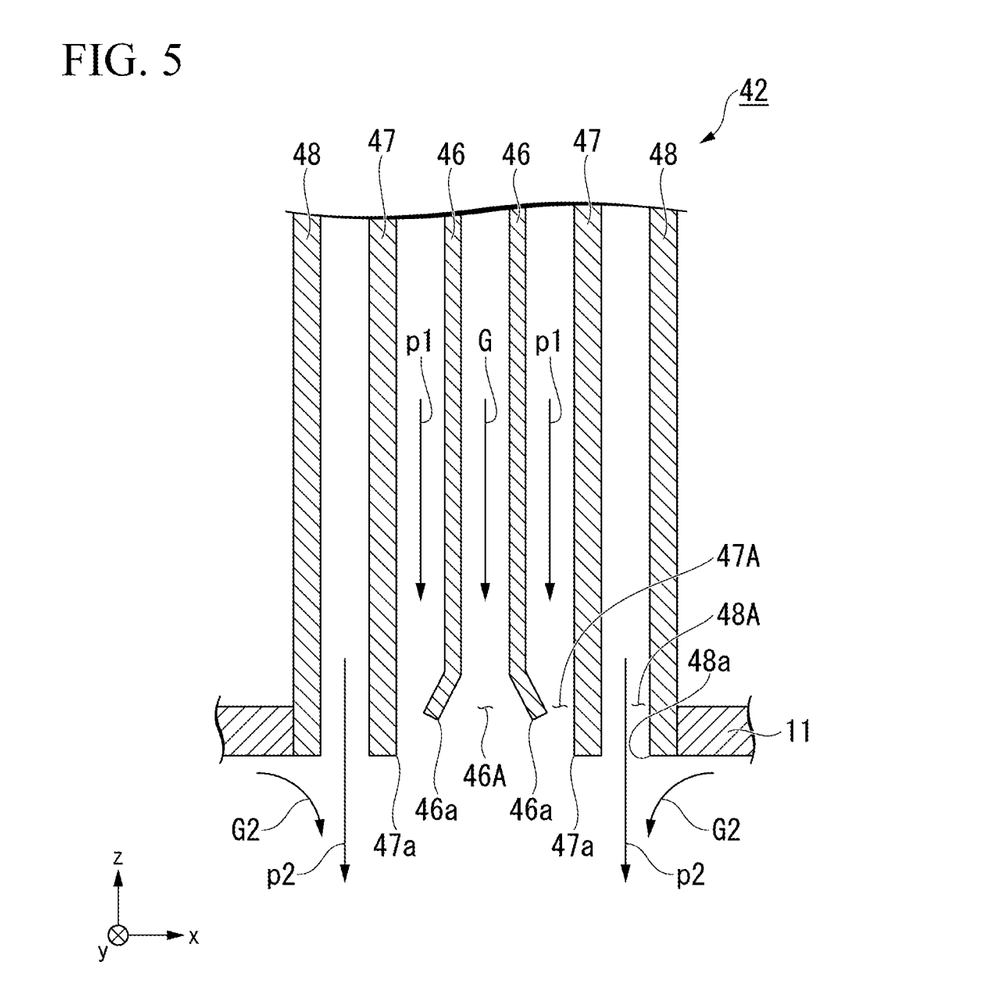
FIG. 5 is an enlarged cross-sectional view of the vicinity of a gas supply portion in the modification example of the SiC epitaxial growth apparatus according to the first embodiment.
Figure 6:
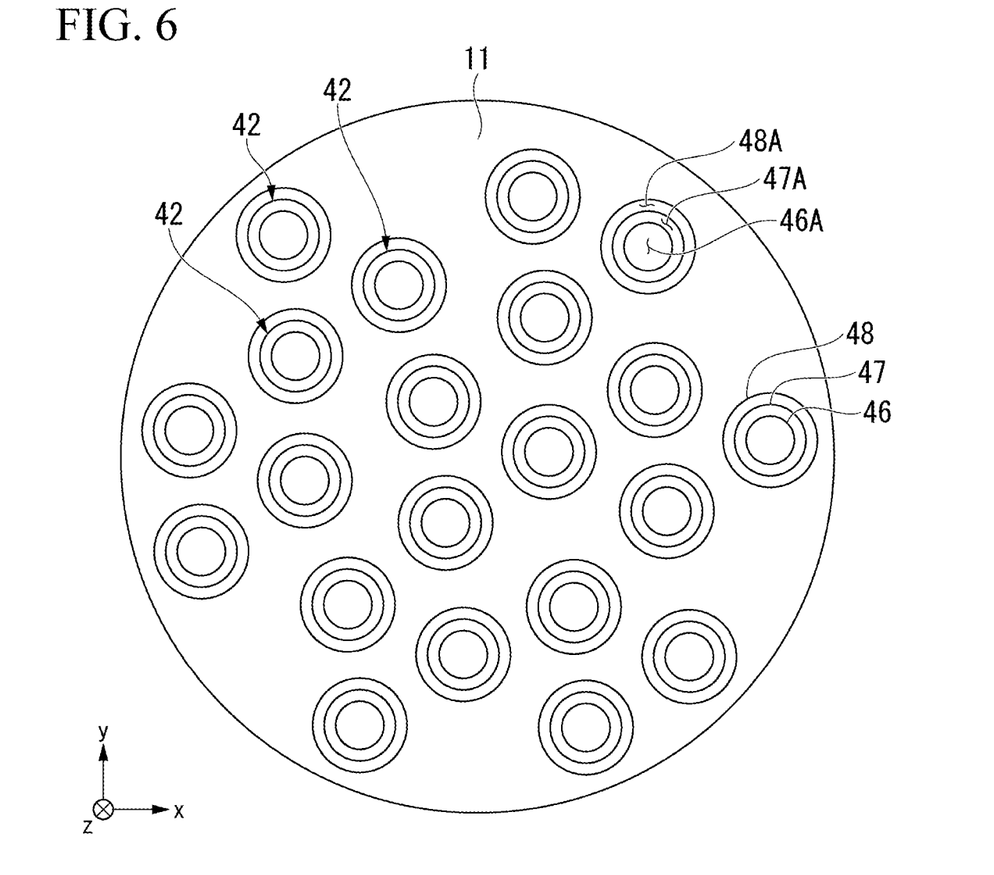
FIG. 6 is a plan view when a ceiling portion in the modification example of the SiC epitaxial growth apparatus according to the first embodiment is seen from a growth space side.

FIG. 5 is an enlarged cross-sectional view of the vicinity of a gas supply portion 42 of the SiC epitaxial growth apparatus 101 according to Modification Example 1. In addition, FIG. 6 is a plan view when a ceiling portion 11 in the SiC epitaxial growth apparatus 101 according to Modification Example 1 is seen from a growth space K side.

The gas supply portion 42 includes a raw material gas supply pipe 46, a first purge gas supply pipe 47, and a second purge gas supply pipe 48. The raw material gas supply pipe 46 includes a raw material gas supply port 46A at a first end 46a thereof, and a raw material gas G flows through the raw material gas supply pipe 46. The first purge gas supply pipe 47 includes a first purge gas supply port 47A at a first end 47a thereof, and a purge gas p1 flows through the first purge gas supply pipe 47. The second purge gas supply pipe 48 includes a second purge gas supply port 48A at a first end 48a thereof, and a purge gas p2 flows through the second purge gas supply pipe 48.

The raw material gas supply port 46A, the first purge gas supply port 47A, and the second purge gas supply port 48A have a concentric circle shape. The first purge gas supply port 47A is, for example, an opening that continuously surrounds the outer periphery of the raw material gas supply port 46A. The second purge gas supply port 48A is an opening that continuously surrounds the outer periphery of the first purge gas supply port 47A.

Also in the SiC epitaxial growth apparatus 101 according to Modification Example 1, the purge gas p2 supplied from the second purge gas supply port 48A prevents a second raw material gas G2 from reaching the vicinity of the raw material gas supply port 46A. Therefore, the SiC epitaxial growth apparatus 101 according to Modification Example 1 can suppress variation in growth conditions of a SiC epitaxial film, similar to the SiC epitaxial growth apparatus 100.

Modification Example 2

Figure 7:
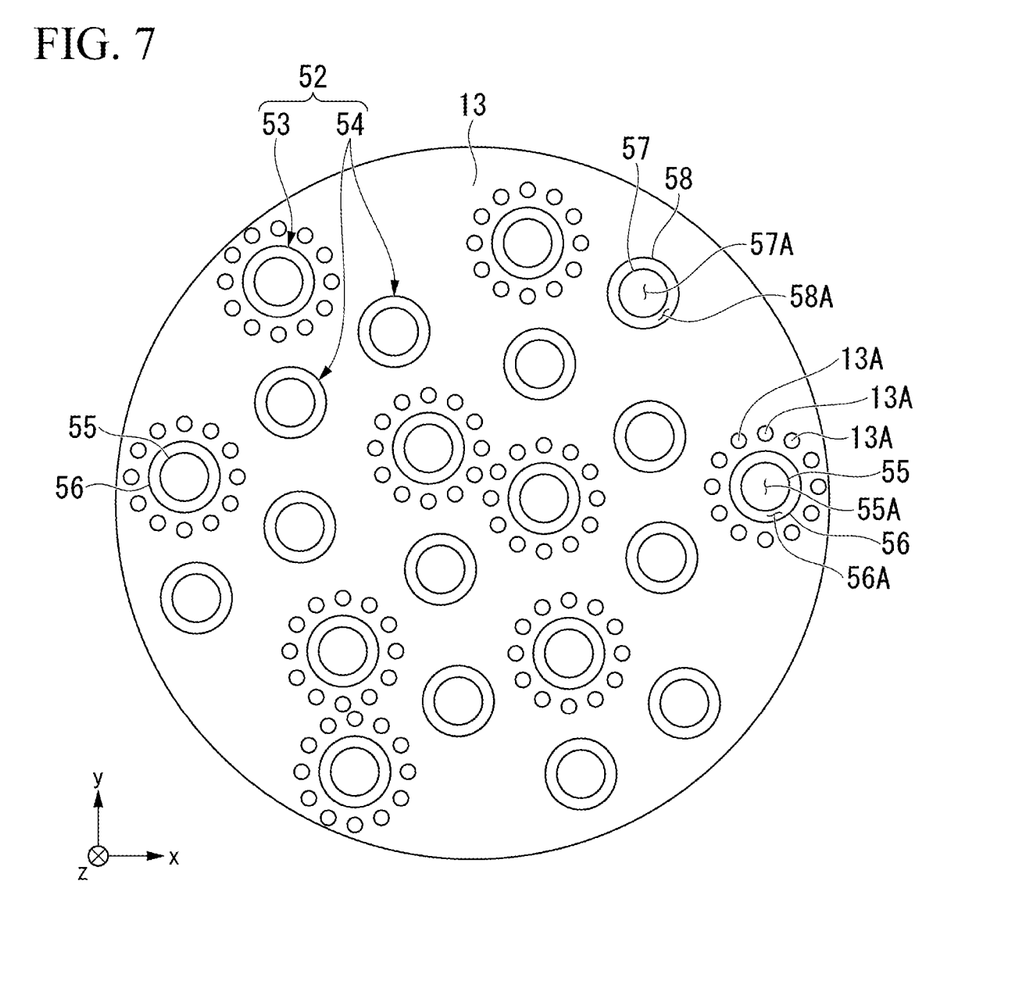
FIG. 7 is a plan view when a partition wall in a modification example of the SiC epitaxial growth apparatus according to the first embodiment is seen from a growth space side.

FIG. 7 is a plan view when a partition wall 13 in a SiC epitaxial growth apparatus according to Modification Example 2 is seen from a growth space K side. The SiC epitaxial growth apparatus according to Modification Example 2 is different from the SiC epitaxial growth apparatus 100 shown in FIG. 1 in regard to a configuration of a gas supply portion 52. The same components as those of the SiC epitaxial growth apparatus 100 shown in FIG. 1 will be denoted by the same reference numerals and signs, and description thereof will be omitted.

Raw material gases are roughly classified into Si-based gases and C-based gases. While a distinction has not been particularly made to the type of raw material gas G to be supplied from a raw material gas supply port, the raw material gas supply ports may be classified into Si-based gas supply ports for supplying a Si-based gas and C-based gas supply ports for supplying a C-based gas.

The SiC epitaxial growth apparatus according to Modification Example 2 includes a Si-based gas supply portion 53 and a C-based gas supply portion 54. The Si-based gas supply portion 53 includes a Si-based gas supply pipe 55 and a first purge gas supply pipe 56. A first end of the Si-based gas supply pipe 55 is a Si-based gas supply port 55A. A first end of the first purge gas supply pipe 56 is a first purge gas supply port 56A. The C-based gas supply portion 54 includes a C-based gas supply pipe 57 and a first purge gas supply pipe 58. A first end of the C-based gas supply pipe 57 is a C-based gas supply port 57A. A first end of the first purge gas supply pipe 58 is a first purge gas supply port 58A.

The second purge gas supply port 13A is provided in the vicinity of the Si-based gas supply portion 53. The second purge gas supply port 13A prevents a C-based gas supplied from the C-based gas supply port 57A from reaching the vicinity of the Si-based gas supply port 55A. Attached matter of SiC is generated when the Si-based gas and the C-based gas decompose and react with each other in the vicinity of the raw material gas supply port 16A. When the C-based gas is prevented from reaching the vicinity of the Si-based gas supply port 55A, generation of the SiC deposits can be sufficiently suppressed. Therefore, the SiC epitaxial growth apparatus according to Modification Example 2 can suppress variation in growth conditions of a SiC epitaxial film, similar to the SiC epitaxial growth apparatus 100.

Meanwhile, contrary to Modification Example 2, the second purge gas supply port 13A may be configured to be provided only in the vicinity of the C-based gas supply portion 54 instead of being provided in the vicinity of the Si-based gas supply portion 53.

EXPLANATION OF REFERENCES

10 Furnace body
10A First hole
10B Second hole
10C Third hole
11 Ceiling portion
12, 42, 52 Gas supply portion
13 Partition wall
13A, 48A Second purge gas supply port
14 Side wall portion
14A First portion
14B Second portion
14C Third portion
15 Bottom portion
15A Hole portion
16, 46 Raw material gas supply pipe
16A, 46A Raw material gas supply port
17, 47, 56, 58 First purge gas supply pipe
17A, 47A, 56A, 58A First purge gas supply port
16a, 17a, 46a, 47a First end
20 Mounting stand
20a Mounting surface
21 Support body
22 Support shaft
30 Heater
31 First heater
32 Second heater
48A Second purge gas supply port
53 Si-based gas supply portion
54 C-based gas supply portion
55 Si-based gas supply pipe
55A Si-based gas supply port
57 Si-based gas supply pipe
57A Si-based gas supply port
100, 101 SiC epitaxial growth apparatus
G Raw material gas
G2 Second raw material gas
K Growth space
p1, p2 Purge gas
P Processing front chamber
W SiC wafer

What is claimed is:

1. A SiC epitaxial growth apparatus comprising:
a mounting stand on which a SiC wafer is mounted; and
a furnace body which is configured to cover the mounting stand and includes a growth space therein,
wherein the furnace body includes
a raw material gas supply port which is positioned so as to face the mounting stand and is configured to supply a raw material gas to the growth space,
a first purge gas supply port which surrounds the raw material gas supply port and is configured to supply a purge gas to the growth space, and
a second purge gas supply port which surrounds a vicinity of the first purge gas supply port and is configured to supply a purge gas to the growth space;
the raw material gas supply port comprises a plurality of raw material gas supply ports,
the first purge gas supply port comprises a plurality of first purge gas supply ports, each of the plurality of first purge gas supply ports comprises an opening that entirely surrounds an outer periphery of one of the plurality of the raw material gas supply ports in a concentric circle,
the raw material gas supply port is a first end of a raw material gas supply pipe for supplying the raw material gas to the growth space,
the first purge gas supply port is a first end of a first purge gas supply pipe for supplying the purge gas to the growth space, the first end of the raw material gas supply pipe is positioned above the first end of the first purge gas supply pipe in a +z direction that is perpendicular to the mounting stand on which the SiC wafer is mounted, and the second purge gas supply port comprises a plurality of second purge gas supply ports, and each of the plurality of second purge gas supply ports is arranged in a concentric circle surrounding only one of the plurality of first purge gas supply ports.

2. The SiC epitaxial growth apparatus according to claim 1, wherein the SiC epitaxial growth apparatus is configured such that a flow velocity of the purge gas supplied from the second purge gas supply port becomes lower than a flow velocity of the purge gas supplied from the first purge gas supply port.

3. The SiC epitaxial growth apparatus according to claim 1, wherein the first purge gas supply port is configured so as to supply a purge gas to the growth space at a flow velocity of greater than 10 m/s and equal to or less than 100 m/s, and the second purge gas supply port is configured so as to supply a purge gas to the growth space at a flow velocity of equal to or greater than 0.1 m/s and equal to or less than 10 m/s.

4. The SiC epitaxial growth apparatus according to claim 1, wherein the second purge gas supply port is positioned on a side outward from an outer periphery of the first purge gas supply port at a distance of 0.5 mm or more therefrom.

5. The SiC epitaxial growth apparatus according to claim 1, wherein the second purge gas supply port is a through hole formed in a partition wall that separates the growth space and a processing front chamber from each other.

6. The SiC epitaxial growth apparatus according to claim 1, wherein the plurality of raw material gas supply ports include a Si-based gas supply port and a C-based gas supply port, and the plurality of second purge gas supply ports are arranged in a concentric circle surrounding the Si-based gas supply port.

7. The SiC epitaxial growth apparatus according to claim 1, wherein the first end of the raw material gas supply pipe has a diameter that increases in a downward −z direction.

* * * * *